(12) United States Patent
Kim et al.

(10) Patent No.: US 6,493,841 B1
(45) Date of Patent: Dec. 10, 2002

(54) METHOD AND APPARATUS FOR DETERMINING EXPECTED VALUES DURING CIRCUIT DESIGN VERIFICATION

(75) Inventors: Won Sub Kim, Fremont, CA (US); Valeria Maria Bertacco, Stanford, CA (US); Daniel Marcos Chapiro, Palo Alto, CA (US); Sandro Hermann Pintz, Menlo Park, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/283,774

(22) Filed: Mar. 31, 1999

(51) Int. Cl.⁷ .......................... G01R 31/28; G06F 11/00
(52) U.S. Cl. ................ 714/741; 714/739; 714/33; 703/17; 709/310; 716/3
(58) Field of Search .................... 714/741, 736, 714/14, 25, 33, 805, 739; 703/14, 17; 716/5, 3; 709/310

(56) References Cited

U.S. PATENT DOCUMENTS

| | | | |
|---|---|---|---|
| 4,070,565 A | 1/1978 | Borrelli | 714/734 |
| 4,937,827 A | 6/1990 | Beck et al. | 714/33 |
| 5,202,889 A | 4/1993 | Aharon et al. | 714/739 |
| 5,469,367 A | 11/1995 | Puri et al. | 716/18 |
| 5,513,122 A | 4/1996 | Cheng et al. | 716/5 |
| 5,530,370 A | 6/1996 | Langhof et al. | 324/754 |
| 5,530,841 A | 6/1996 | Gregory et al. | 716/3 |
| 5,548,525 A | 8/1996 | Albee et al. | 716/4 |
| 5,594,741 A * | 1/1997 | Kinzelman et al. | 714/741 |
| 5,649,164 A * | 7/1997 | Childs et al. | 703/16 |
| 5,684,808 A | 11/1997 | Valind | 714/726 |

(List continued on next page.)

OTHER PUBLICATIONS

U.S. patent application Ser. No. 60/048,755, Hollander et al., filed Jun. 3, 1997.

IBM TDB ("Behavioral Fault Simulation", IBM Technical Disclosure Bulletin, vol. 28, No. 4, Sep. 1, 1985, pp. 1577–1578 (1–3)).

Yang et. al. ("Scheduling and control generation with environmental constraints based on automata representations", IEEE Transactions on Computer–Aided Design of Integrated Circuits and Systems, vol. 15, No. 2, Feb. 1996, pp. 166–183).

(List continued on next page.)

Primary Examiner—Emmanuel L. Moise
(74) Attorney, Agent, or Firm—Howrey, Simon, Arnold & White, LLP; Jonathan T. Kaplan

(57) ABSTRACT

Hardware Verification Languages (HVLs) permit the convenient modeling of the environment for a device under test (DUT). HVLs permit the DUT to be tested by stimulating certain inputs of the DUT and monitoring the resulting states of the DUT. The present invention relates to an HVL, referred to as Vera, for the verification of any form of digital circuit design. Vera is preferably used for testing a DUT modeled in a high-level hardware description language (HLHDL) such as Verilog HDL. More specifically, the present invention relates to an HVL capability, know as an "expect," for monitoring the values at certain nodes of the DUT at certain times and for determining whether those values are in accordance with the DUT's expected performance. In particular, upon the first occurrence of a transition on one of the DUT's nodes, since beginning a window period of monitoring, the expect will either generate an error if the DUT's output is unexpected, or proceed with modeling the DUT's environment if the output is expected. A delay may be specified, which will delay the expect's initiation of the window monitoring period.

15 Claims, 11 Drawing Sheets

U.S. PATENT DOCUMENTS

| | | | | |
|---|---|---|---|---|
| 5,784,377 A | | 7/1998 | Baydar et al. ............... | 370/463 |
| 5,841,967 A | * | 11/1998 | Sample et al. ................ | 714/33 |
| 5,870,590 A | | 2/1999 | Kita et al. ...................... | 716/4 |
| 5,905,883 A | * | 5/1999 | Kasuya ......................... | 703/17 |
| 5,907,494 A | | 5/1999 | Dangelo et al. ............... | 703/1 |
| 5,920,490 A | | 7/1999 | Peters ........................... | 716/2 |
| 6,006,028 A | | 12/1999 | Aharon et al. ................ | 703/21 |
| 6,035,109 A | | 3/2000 | Ashar et al. .................... | 716/3 |
| 6,044,211 A | | 3/2000 | Jain ............................ | 716/18 |
| 6,076,083 A | | 6/2000 | Baker .......................... | 706/52 |
| 6,077,304 A | * | 6/2000 | Kasuya ......................... | 703/14 |
| 6,081,864 A | | 6/2000 | Lowe et al. ................ | 710/100 |
| 6,110,218 A | | 8/2000 | Jennings ...................... | 703/22 |
| 6,141,630 A | | 10/2000 | McNamara et al. .......... | 703/14 |
| 6,167,363 A | | 12/2000 | Stapleton ...................... | 703/14 |
| 6,182,258 B1 | | 1/2001 | Hollander ................... | 714/739 |
| 6,192,504 B1 | | 2/2001 | Pfluger et al. ................. | 716/1 |
| 6,212,625 B1 | | 4/2001 | Russell ....................... | 712/217 |
| 6,219,809 B1 | | 4/2001 | Noy ........................... | 714/724 |

OTHER PUBLICATIONS

Cabodi et al. ("Extending equivalence class computation to large FSMs", 1995 IEEE International Conference on Computer Design: VLSI in Computers and Processors, Oct. 2, 1995, pp. 258–263).

Hsiao et al. ("Fast static compaction algorithms for sequential circuit test vectors", IEEE Transactions on Computers, vol. 48, No. 3, Mar. 1999, pp. 311–322).

Pomeranz et al. ("ACTIV–LOCSTEP: a test generation procedure based on logic simulation and fault activation", Twenty–Seventh Annual International Symposium on Fault– Tolerant Computing, 1997, FTCS–27, Digest of Papers, Jun. 24, 1997, pp. 144–151).

Mark R. Headington and David D. Riley, "Data Abstraction and Structures Using C++", D.C. Health and Company, 1994, pp. 72–79, 144–149, 492–497, and 506–517.

Gary York, Robert Mueller–Thuns, Jagat Patel and Derek Beatty, "An Integrated Environment for HDL Verification", IEEE 1995, pp. 9–18.

A. J. van der Hoeven, P. van Prooijen, E. F. Deprettere and P. M. Dewilde, "A Hardware Design System based on Object–Oriented Principles", IEEE, 1991, p. 459–463.

* cited by examiner

FIGURE 1 expect_operator delay window expect_list ;

FIGURE 2A

@ delay window expect_list ;

FIGURE 2B

@@ delay window expect_list ;

FIGURE 2C

@@@ delay window expect_list ;

FIGURE 3A expression1, expression2, ... expressionN

FIGURE 3B expression1 or expression2 or ... expressionN

FIGURE 4 signal_name operator value_expression

FIGURE 5

<size>'<base><number>

FIGURE 6A
(PRIOR ART)

Step 1: Is "delay" specification >0?

Yes, go to Step 2 of Figure 6A.

No, go to Step 3 of Figure 6A.

Step 2: Wait "delay" clock edges of delay/window clock.

Step 3: Wait until clock edge associated with delay/window clock.

Step 4: Does signal1 value match expected value?

Yes, go to next Vera language statement

No, go to Step 5 of Figure 6A.

Step 5: Is "window" specification >0?

Yes, go to Step 6 of Figure 6A.

No, generate simulation error

Step 6: Set window counter

Step 7: Wait until next clock edge associated with delay/window clock.

Step 8: Does signal1 match expected value?

Yes, go to next Vera language statement

No, go to Step 9 of Figure 6A.

Step 9: Decrement window counter

FIGURE 6B
(PRIOR ART)

Step 10: Is window counter >0?

Yes, go to Step 7 of Figure 6A.

No, generate simulation error

FIGURE 7A
(PRIOR ART)

Step 1: Is "delay" specification >0?

Yes, go to Step 2 of Figure 7A.

No, go to Step 3 of Figure 7A.

Step 2: Wait "delay" specified edges of delay/window clock.

Step 3: Wait until clock edge associated with delay/window clock.

Step 4: Does signal1 value match expected value?

Yes, go to Step 5 of Figure 7A.

No, generate simulation error

Step 5: Is "window" specification >0?

Yes, go to Step 6 of Figure 7A.

No, go to next Vera language statement

Step 6: Set window counter

Step 7: Wait until next clock edge associated with delay/window clock.

Step 8: Does signal1 match expected value?

Yes, go to Step 9 of Figure 7A.

No, generate simulation error

Step 9: Decrement window counter

FIGURE 7B
(PRIOR ART)

Step 10: Is window counter >0?

Yes, go to Step 7 of Figure 7A.

No, go to next Vera language statement

FIGURE 8A

Step 1: Is "delay" specification >0?
    Yes, go to Step 2 of Figure 8A.
    No, go to Step 3 of Figure 8A.

Step 2: Wait "delay" specified clock edges of delay/window clock.

Step 3: Wait until clock edge associated with delay/window clock.

Step 4: Does signal1 value match expected value?
    Yes, go to next Vera language statement
    No, go to Step 5 of Figure 8A.

Step 5: Is "window" specification >0?
    Yes, go to Step 6 of Figure 8A.
    No, generate simulation error Step 6: Set window counter Step 7: Wait until next clock edge associated with delay/window clock.

Step 8: Has value of signal1 changed?
    Yes, go to Step 9 of Figure 8A.
    No, go to Step 10 of Figure 8B.

Step 9: Does signal1 match expected value?
    Yes, go to next Vera language statement
    No, generate simulation error

FIGURE 8B

Step 10: Decrement window counter

Step 11: Is window counter >0?

Yes, go to Step 7 of Figure 8A.

No, generate simulation error

FIGURE 9A

Step 1: Is "delay" specification >0?

Yes, go to Step 2 of Figure 9A.

No, go to Step 8 of Figure 9A.

Step 2: Set special counter (not discussed in the Verilog/Vera synchronization discussion above). This special counter is accessable by vera_main and is set with the number of cycles of the delay/window clock which must occur before the expect_list should be considered.

Step 3: Put context(X) on the wait queue.

Step 4: Context(X) waits for the next clock edge associated with the delay/window clock to occur.

Step 5: When the next edge of delay/window clock occurs, rather than taking context(X) off the wait queue, vera_main decrements the special counter for context(X).

Step 6: Special counter == 0?

No -- go to Step 3 of Figure 9A.

Yes -- go to Step 7 of Figure 9A.

Step 7: vera_main takes context(X) off the wait queue and puts it on the run queue.

Step 8: delay/window clock becomes a potential trigger which can cause context(X) to be moved back to the run queue.

Step 9: Put context(X) back on wait queue.

Step 10: Context(X) waits for delay/window clock.

FIGURE 9B

Step 11: Move context(X) from wait queue to run queue.

Step 12: context(X) checks to see whether the current values of the nodes of the Verilog model (specified by the signal_names of the expect_list) satisfy the conditions tested for by the expect_list. context(X) checks the nodes of the Verilog model through the PLI calls, discussed above, which allow Vera to sample the value of Verilog nodes.

Yes -- processing by context(X) immediately "falls through" to the next Vera language statement in the flow of control after restricted expect.

No -- go to Step 13 of Figure 9B.

Step 13: Is "window" specification > 0?

No -- generate simulation error since expect_list not satisfied immediately upon elapse of delay period and no window period is specified.

Yes -- go to Step 14 of Figure 9B.

Step 14: Set a window counter of context(X) with the number of cycles of the delay/window clock which constitute window period. In addition, delay/window clock becomes a potential trigger which can cause context(X) to be moved back to the run queue.

Step 15: Put context(X) on the wait queue.

Step 16: Context(X) waits for the next edge associated with delay/window clock to occur.

FIGURE 9C

Step 17: Move context(X) from wait queue to run queue.

Step 18: Have any of the Verilog nodes monitored by the expect_list changed?
    Yes -- go to Step 19 of Figure 9C.
    No -- go to Step 20 of Figure 9C.

Step 19: Do the Verilog nodes values satisfy the expect_list?
    No -- generate simulation error since first transition of an expect_list signal has occurred and expect_list is not satisfied Yes -- fall through to next Vera language statement beyond this restricted expect Step 20: Decrement window counter of context(X)

Step 21: window counter == 0?
    No -- go to Step 15 of Figure 9B.

Yes -- generate simulation error since end of window is reached without any transition of the expect_list since window period began.

METHOD AND APPARATUS FOR DETERMINING EXPECTED VALUES DURING CIRCUIT DESIGN VERIFICATION

MICROFICHE APPENDIX

This patent includes a Microfiche Appendix which consists of a total of 5 microfiche that contain a total of 442 frames.

FIELD OF THE INVENTION

The present invention relates generally to verification languages, and more particularly to language statements which verify whether a system under test has responded to a stimulus with certain expected values.

BACKGROUND OF THE INVENTION

To tackle the increasing complexity of integrated digital electronic circuits, designers need faster and more accurate methods for verifying the functionality and timing of such circuits, particularly in light of the need for ever-shrinking product development times.

The complexity of designing such circuits is often handled by expressing the design in a high-level hardware description language (HLHDL). The HLHDL description is then converted into an actual circuit through a process, well known to those of ordinary skill in the art as "synthesis," involving translation and optimization. Typical examples of an HLHDL are IEEE Standard 1076–1993 VHDL and IEEE Standard 1364–1995 Verilog HDL, both of which are herein incorporated by reference.

An HLHDL description can be verified by simulating the HLHDL description itself, without translating the HLHDL to a lower-level description. This simulation is subjected to certain test data and the simulation's responses are recorded or analyzed.

Verification of the HLHDL description is important since detecting a circuit problem early prevents the expenditure of valuable designer time on achieving an efficient circuit implementation for a design which, at a higher level, will not achieve its intended purpose. In addition, simulation of the design under test (DUT) can be accomplished much more quickly in an HLHDL than after the DUT has been translated into a lower-level, more circuit oriented, description.

The verification of HLHDL descriptions has been aided through the development of Hardware Verification Languages (or HVLs). Among other goals, HVLs are intended to provide programming constructs and capabilities which are more closely matched to the task of modeling the environment of an HLHDL design than are, for example, the HLHDL itself or software-oriented programming languages (such as C or C++). HVLs permit a DUT, particularly those DUTs expressed in an HLHDL, to be tested by stimulating certain inputs of the DUT and monitoring the resulting states of the DUT.

SUMMARY OF THE INVENTION

The present invention relates to an HVL, referred to as Vera, for the verification of any form of digital circuit design. Vera is preferably used for testing a DUT modeled in a high-level hardware description language (HLHDL) such as Verilog HDL.

More specifically, the present invention relates to an HVL capability, known as an "expect," for monitoring the values at certain nodes of the DUT at certain times and for determining whether those values are in accordance with the DUT's expected performance.

In particular, the present invention relates to a form of expect referred to as "restricted." When a restricted expect is first executed as part of a Vera language program, an initial check is made to determine whether the DUT's nodes monitored by the expect have the anticipated values. If these nodes do, then the restricted expect is considered to have been satisfied, and processing of the Vera language program continues with the next statements in its flow of control. If the expect is not satisfied immediately, it will then check whether a window of time has been specified during which it may still be satisfied. If no window of time is specified, then the expect is not satisfied and a "simulation error" is generated. If a window of time is specified, then during that time period the expect will monitor for the first transition on any of the nodes whose value it is programmed to check. At the time of this first transition, if the DUT's nodes do correspond to the expected values, then the expect is satisfied. If the DUT's nodes do not correspond to the expected values, then the expect is not satisfied and a simulation error is generated. If, upon the conclusion of the window period, no transition has occurred on any of the nodes monitored by the expect, then the expect is also not satisfied and a simulation error is generated. An offset "delay" may also be specified, which will delay any monitoring by the expect, as well as any action which the expect might take as a result of that monitoring, for a specified time period.

Advantages of the invention will be set forth, in part, in the description that follows and, in part, will be understood by those skilled in the art from the description or may be learned by practice of the invention. The advantages of the invention will be realized and attained by means of the elements and combinations particularly pointed out in the appended claims and equivalents.

BRIEF DESCRIPTION OF THE DRAWINGS

The accompanying drawings, that are incorporated in and constitute a part of this specification, illustrate several embodiments of the invention and, together with the description, serve to explain the principles of the invention:

FIG. 1 depicts the general syntax for an expect statement as part of the Vera language;

FIGS. 2A–2C depict the syntax for three varieties of expect statements that are part of the Vera language;

FIGS. 3A–3B show the specific syntax for the expect_list portion of an expect statement, showing how an expect statement can be written to either be satisfied when all of the nodes it tests for have the expected value (an AND function), or to be satisfied when any one of the nodes it tests for has the expected value (an OR function);

FIG. 4 illustrates the syntax by which an individual node of a DUT is compared, according to a particular operator, to a particular expected value expression;

FIG. 5 shows the syntax by which a particular expected value expression is form;

FIGS. 6A–6B are flowcharts depicting the prior art semantics, from the perspective of a Vera language programmer, of a Vera simple expect statement;

FIGS. 7A–7B are flowcharts depicting the prior art semantics, from the perspective of a Vera language programmer, of a Vera full expect statement;

FIGS. 8A–8B is a flowchart depicting semantics in accordance with the present invention, from the perspective of a Vera language programmer, that are the semantics of a Vera restricted expect statement;

FIGS. 9A–9B is a flowchart depicting semantics and implementation in accordance with the present invention.

DETAILED DESCRIPTION OF PREFERRED EMBODIMENTS

Figure 10:
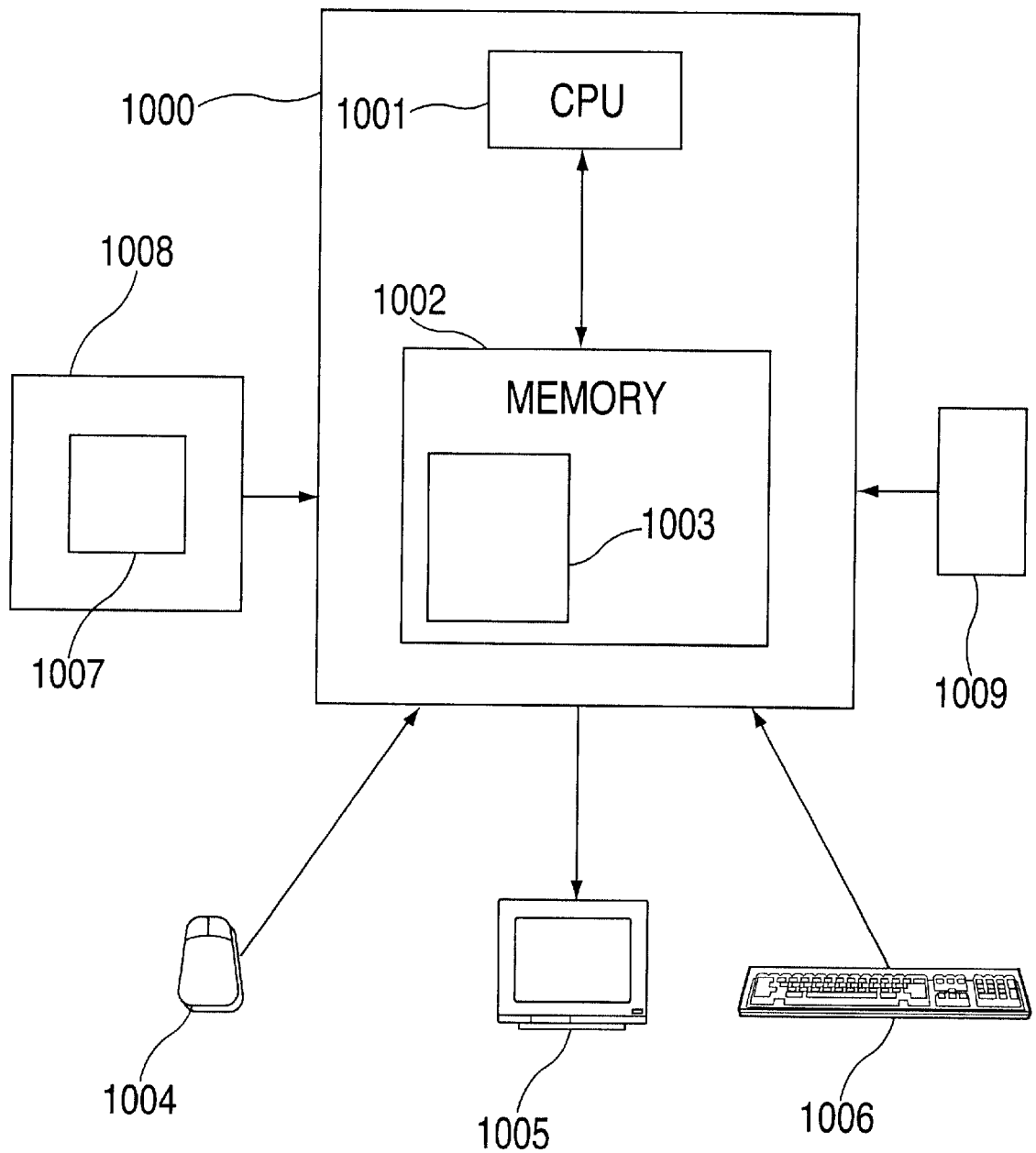
FIG. 10 depicts a computing environment (or data processing system) within, typically, the expect monitoring of the present invention is executed.

Reference will now be made in detail to preferred embodiments of the invention, examples of which are illustrated in the accompanying drawings. Wherever possible, the same reference numbers will be used throughout the drawings to refer to the same or like parts.

1. Overview re Verilog and Vera

The present invention relates to the Vera Verification System language (Vera) from Systems Science Inc., Palo Alto, Calif. (which is now part of Synopsys, Inc., Mountain View, Calif., U.S.A.), hereinafter referred to as the "Vera language." A comprehensive presentation of the Vera language, and its capabilities, is presented in the Vera User's Manual which is included in the present patent as a Microfiche Appendix. As part of the verification process described above, a program written in the Vera language models the environment of the DUT by producing the test data or signals to which the DUT is subjected as well as recording or analyzing the DUT's responses. A Vera language model can be used to test any kind of DUT, provided that the appropriate interface is provided. Vera is primarily utilized, at present, with DUTs that are modeled in the Verilog HDL language (hereinafter referred to as the "Verilog language") and are being executed on an event-driven simulator. However, a Vera model could be utilized with a DUT expressed in other languages and executed on other event-driven or cycle-driven simulators. For example, the DUT could be expressed in the VHDL language. The DUT which the Vera language program is testing need not even be a software simulation. For example, the DUT to be tested could be emulated in hardware, or could even be an actual integrated circuit.

The primary usage of the Vera language, that being its usage in conjunction with an event-driven Verilog-modeled DUT, interfaces and synchronizes with a DUT as follows. This general topic of interfacing and synchronization is also discussed in the Microfiche Appendix, Chapter 1.

The Verilog simulator and the Vera simulator are both event-driven simulators that run in a synchronized fashion which may be described as a very efficient form of co-simulation. The Verilog simulator executes a Verilog language model of the hardware device under test (DUT) while the Vera simulator executes a Vera language model of the environment in which the DUT is to be tested. As an environment simulator, the basic functionality of the Vera simulator is to stimulate the DUT by driving certain of its inputs and to monitor the resulting states of the DUT by sampling the values of its nodes.

The Vera simulator implements the Vera language in the following manner. The Vera language is a high-level object-oriented programming language. Programs written in the Vera language are first compiled into lower-level instructions in Vera assembly code. These Vera assembly code instructions are interpreted by the C or C++ routines which comprise the Vera simulator.

The co-simulation is started from the Verilog simulator side since, according to the present embodiment, the Verilog simulator is the main program started by the user and the Vera simulator is a special application which has been linked into Verilog through Verilog's interface for the high-level software-oriented programming languages of C or C++. The Verilog simulator may be any one of a variety of conventional Verilog simulators, such as VCS produced by Synopsys, Inc., or Verilog-XL produced by Cadence Design Systems of San Jose, Calif. At certain carefully controlled points in time, to be described in more detail below, the Verilog simulation is halted and the Vera simulation is run in a non-preemptive fashion.

Specifically, the Verilog simulator has a programming language interface (PLI) which allows applications written in C or C++ to communicate with the device under test (DUT) as modeled in the hardware-oriented language of Verilog. An example of such an application, that is written in C or C++, is the Vera simulator. The PLI has the following specific features. It permits Verilog language procedures to call specific C or C++ procedures. It permits C or C++ procedures (such as those which implement the Vera simulator) to establish certain nodes of the Verilog model as "callback" nodes. Whenever a node in Verilog, marked as a callback node, changes in value a specific C or C++ procedure or procedures are called. The PLI further permits C or C++ procedures to insert, at a specific time slot in the event queue of the Verilog simulator, a callback to a specific Vera procedure. In addition, the PLI provides functions through which Vera language programs can both examine the value of certain nodes in the Verilog simulation and set the value of certain Verilog nodes. While PLI functions permit Vera to immediately examine the value of certain Verilog nodes, the setting of Verilog nodes becomes a scheduled event in Verilog which is actually performed when Verilog is restarted.

The specifics of the Verilog/Vera co-simulation, and its utilization of the PLI functions described above, are as follows.

The Verilog language module first started, when the user begins the Verilog simulation, is called "vshell." vshell calls the Vera simulator procedure "vmc_init" through the PLI. vmc_init performs the following five major functions: i) it loads the Vera assembly language program to be executed by the Vera simulator, ii) it sets up certain nodes of the Verilog model as callback nodes, iii) it creates a "master" context of level 0, which we shall also refer to as "context(0)," for the execution of the main Vera language program, iv) it places context(0) on "the run queue" of the Vera simulator which holds all Vera language contexts waiting to be run and v) it calls "vera_main," the main routine of the Vera simulator. The nodes which vmc_init establishes as callback nodes in step (ii) are typically: i) the Verilog model's Vera system clock, and ii) those clocks specified by Vera language interface statements.

The Vera interface statement is a programming construct by which certain signals in the Vera model (which we shall refer to as "data" signals) are connected to certain signals in the Verilog model (which we shall also refer to as "data" signals), and the communication of information between the two models is synchronized with a single signal of the Verilog model that is defined as the clock signal for that particular interface. A Vera language program may contain multiple interfaces and each interface may have a different signal selected as its clock. If an interface does not specify a clock, then the user designated default clock node (called the "Vera system clock") is used. (The Vera system clock is a Verilog node that represents Vera's system clock.) In addition to specifying a clock, the interface statement specifies the particular edge (positive or negative) of the clock upon which each data signal of the interface is to be driven or observed. In addition, the interface can specify a certain skew time, before the selected edge of the interface's clock, at which each data signal is to be observed by Vera. The interface can also specify each data signal as being driven by Vera a certain skew time <u>after</u> the selected edge of the interface's clock.

The direct call by vmc_init to vera_main, rather than starting the Verilog simulation, is necessary since there may be instructions in the Vera language program that vera_main can execute <u>before</u> any clock events have occurred in the Verilog simulation. vera_main always begins by performing the following two major operations: i) checking the queue of contexts waiting to be executed for any contexts which, in light of the clock edge which has just occurred to cause vera_main to be called, should now be transferred to the run queue, and ii) running, in turn, each context on the run queue.

At this early point in the co-simulation's execution, the wait queue will be empty but the run queue will have the main Vera language context, context(0), created by vmc_init. context(0) will execute until it reaches a Vera construct which requires a clock edge which has not occurred yet. It is significant to note that context(0) may fork off one or more sub-contexts, which we shall refer to as context(1), context(2), . . . . Each of these sub-contexts is also put on the run queue and executed until a clock edge, which has not yet occurred, is required. As each context is executed as far as it can be, without a further clock edge occurring, the context is moved from the run queue to the wait queue with a notation as to the clock edge it requires before it can continue execution. When the run queue is finally empty of contexts to execute, vera_main returns control to vmc_init. vmc_init returns control to vshell and vshell starts the main Verilog language module that is modeling the DUT.

The Verilog modules modeling the DUT execute until a change occurs to a clock node which causes the calling of a callback procedure of Vera. The Vera system clock node preferably has its own first callback procedure, independent of a second callback procedure shared by all other clock nodes as specified in Vera interface statements. This separation into two callback procedures is done in order to improve the speed of callback processing. Each of these callback procedures, however, operates as follows. First, the callback procedure determines whether the clock edge which caused the procedure to be called is of the right type (either positive or negative) for any data signal of any interface statement it serves as clock signal for. If the clock edge is of the right type for any data signal of any interface statement to which the clock is connected as the clock of that interface statement, then the callback procedure inserts into the Verilog event queue, at the end of the current time step in which the callback procedure was called (and immediately before the following the time step), a PLI call to vera_main which also contains an indication of the Verilog clock signal which changed, and the nature of the transition (positive or negative). The callback procedure then returns control to the Verilog modules simulating the DUT which will continue processing any events at the current time step of the Verilog event queue. Assuming that the callback procedure inserted a PLI call to vera_main, as soon as all events in the event queue at the current Verilog time step are exhausted, the inserted call to vera_main is executed.

When vera_main is called, through a PLI call inserted in the Verilog event queue, the clock and transition it represents is checked against the contexts waiting for a clock transition in the wait queue. As discussed above for vera_main, it will compare those contexts which are waiting to the particular clock transition which produced this call and will transfer to the run queue those contexts which are now satisfied. Each context in the run queue is then executed until all contexts have been executed as far as they can without a new clock edge and are either: i) finished, or ii) back on the wait queue. If a skew has been specified in the interface statement for data signals being used by a context, that skew is accomplished during the running of the contexts as follows. Data signals which are to be observed by Vera a certain skew time before the clock edge are observed through a delay device at the time of the clock edge. Data signals which are to be driven by Vera a certain skew time after the clock edge are driven through a delay device at the time of the clock edge. Once the run queue is empty, control is returned to the Verilog simulation at the point just after the inserted PLI call to vera_main.

While most Verilog/Vera communication is typically synchronized through interface statements as described above, there are two additional forms of synchronization: i) a Vera language specification that the Verilog simulation call the Vera simulation at some particular point in time of the Verilog simulation, and ii) a Vera language specification that the Verilog simulation call the Vera simulation upon a specified asynchronous transition of a specified signal, independent of any other clock signal. Each of these two additional forms of synchronization is handled by an additional callback procedure, in addition to the two callback procedures discussed above. As with the callback procedures discussed above, this division into two additional callback procedures is done in order to increase the speed of callback processing. Both of these two additional forms of Verilog/Vera synchronization are accomplished by having vmc_init perform some additional operations during step (ii) of the five major vmc_init functions described above. With regard to each call to Vera at a Verilog time, vmc_init through the PLI inserts in the event queue of Verilog, at the appropriate point in time, a call to a third callback procedure which is optimized for handling this type of callback situation. This third callback procedure inserts into the Verilog event queue, at the end of the time step in which the third callback procedure was called (and immediately before the following the time step), a PLI call to vera main which also contains an indication of the time step at which Verilog has arrived. The callback procedure then returns control to the Verilog modules simulating the DUT which will continue processing any events at the current time step of the Verilog event queue before the inserted call to vera_main is executed. vera_main will then check the time passed to it against any contexts which are waiting for that time to occur before executing. vera_main will continue executing various contexts until the run queue becomes empty, at which point control is returned to the Verilog simulation at the point just after the inserted PLI call to vera_main. With regard to the asynchronous Vera call, vmc_init through the PLI sets up these asynchronous nodes as calling a fourth callback procedure. This fourth callback procedure investigates whether the transition which has occurred is the one sought for by a particular Vera language statement and if so, inserts into the Verilog event queue, at the end of the time step in which the fourth callback procedure was called (and immediately before the following the time step), a PLI call to vera_main which also contains an indication of the node which has changed and the transition type. The callback procedure then returns control to the Verilog modules simulating the DUT which will continue processing any events at the current time step of the Verilog event queue before the inserted call to vera_main is executed. vera_main will then check the asynchronous transition indication passed to it against any contexts which are waiting for that transition to occur before executing. vera_main will continue executing various contexts until the run queue becomes empty, at which point control is returned to the Verilog simulation at the point just after the inserted PLI call to vera_main.

2. Vera Language Expect Statement Programming

Critical to any verification language is the ability to monitor the values at certain nodes of the DUT at certain times and to determine whether those values are in accordance with the DUT's expected performance. The present invention adds to Vera capabilities in this crucial area.

Specifically, the present invention relates to a statement, called a "restricted expect," which is described in the Microfiche Appendix at Section 4.4.4.

The general syntax for an expect statement is shown in FIG. 1. There are three varieties of expect, depending upon the value of the expect operator. These three varieties are shown in FIGS. 2A–2C, and are described, respectively, in Sections 4.4.4.1–4.4.4.3 of the Microfiche Appendix. The syntax for these three varieties of expects is basically the same. The expect op is followed by a "delay" and a "window" specification. The "delay" basically specifies an offset delay before which the expect is not actually monitoring. The "window" basically specifies a time period during which the expect may continue to monitor. The "delay" and "window" specifications are followed, syntactically, by an expect_list which specifies the nodes of Verilog to be monitored and the values to expect for each node. Before describing the syntax of the expect_list, the basic functionality of each variety of expect will be explained in terms of testing the value of a single signal called "signal1."

Associated with signal1, by a Vera language interface statement, is a clock and an edge of that clock (also referred to more simply as a "clock edge") which we shall refer to as the "delay/window clock." The delay/window clock is utilized to: i) determine when to sample the value of the Verilog node corresponding to signal1, ii) measure offset "delay" and iii) measure "window" delay.

The expect as shown in FIG. 2A, referred to as a "simple" expect, is specified by using "@" as the expect_operator. When encountered as part of the flow of control of a program written in the Vera language, the simple expect operates according to the flowcharts of FIGS. 6A–6B, whose Steps are referred to in the following discussion. Note that the processing of the Steps illustrated in all of the flowcharts of the present patent proceed sequentially, in order of increasing Step number, unless an explicit "go to" of a Step indicates otherwise.

While the simple expect of FIGS. 6A–6B is presented in this section for purposes of clarity of exposition, it is in fact admitted prior art to the present invention.

Step 1 checks to see whether a "delay" has been specified. The "delay" specifies a time period before which there is no testing of whether signal has the expected value. If a delay is specified, then Step 2 waits the number of cycles of the delay/window clock, specified by the "delay" value, before proceeding to Step 3. If no delay is specified, then processing proceeds directly to Step 3.

At Step 3 the simple expect waits until the clock edge associated with the delay/window clock occurs before proceeding to Step 4.

At Step 4 the current value of the Verilog node corresponding to signal1 is determined and is compared with a value it is expected to be. If signal1 has the expected value, then this simple expect statement is finished and processing of the Vera program continues with the next Vera language statement in the flow of control. If signal1 does not have the expect value, then Step 5 of the simple expect is executed.

Step 5 determines whether a "window" time period has been specified. If not, a simulation error is generated since signal1 has already been determined not to have the expected value and no further time has been specified during which it might achieve the expected value.

If a time window has been specified, then processing continues with Step 6 where a "window counter" is set.

Next, at Step 7, processing of the simple expect waits until another clock edge of the delay/window clock occurs. When this event happens, processing continues with Step 8.

Step 8 checks once again whether the current value of the Verilog node indicated by signal1 has the expected value. If it does, then this simple expect statement is finished and processing continues with the next Vera language statement. If signal1 does not have the expected value, then processing continues with Step 9 since there may still be remaining "window" period during which signal1 may achieve the expected value.

Step 9 decrements the window counter, while Step 10 tests to see whether that counter is still >0. If it is, then processing loops back to Step 7, since the window is permitting more time during which signal1 could still achieve the expected value. If the counter is zero, however, the time of the window has expired without signal1 ever achieving the expected value and so a simulation error is generated.

The expect as shown in FIG. 2B, referred to as a "full" expect, is specified by using "@@" as the expect_operator. When encountered as part of the flow of control of a program written in the Vera language, the full expect operates according to the flowchart of FIG. 7, whose Steps are referred to in the following discussion unless the Steps of another Figure are specifically indicated.

While the full expect of FIGS 7A–7B is presented in this section for purposes of clarity of exposition, it is in fact admitted prior art to the present invention.

Steps 1–3 operate in the same manner as Steps 1–3 for a simple expect.

At Step 4 the current value of the Verilog node corresponding to signal1 is determined and is compared with a value it is expected to be. If signal1 has the expected value, then processing of this full expect statement continues at Step 5 since signal1 must maintain the expected value throughout any specified "window" period. If signal1 does not have the expected value, then a simulation error is generated.

Step 5 determines whether a "window" time period has been specified. If not, then processing of this full expect statement is finished and the Vera language program continues with execution of the next Vera language statement in the flow of control. If a time window has been specified, then processing continues with Step 6 where a "window counter" is set.

Steps 7 waits until the next edge of the delay/window clock.

Step 8 checks once again whether the current value of the Verilog node indicated by signal1 still has the expected value. If it does, then processing of this full expect statement continues by proceeding to Step 9 since signal1 must maintain the expected value throughout any specified "window" period. If signal1 does not have the expected value, then a simulation error is generated.

Step 9 decrements the window counter, while Step 10 tests to see whether that counter is still >0. If it is, then processing loops back to Step 7, since the window is requiring more time during which signal1 must still maintain the expected value. If the counter is zero, however, the time of the window has expired with signal1 maintaining the expected value throughout and so processing of this full expect statement has concluded successfully—the next Vera language statement is therefore executed.

The expect as shown in FIG. 2C, referred to as a "restricted" expect, is specified by using "@@@" as the expect operator. When encountered as part of the flow of control of a program written in the Vera language, the restricted expect operates according to the flowchart of FIG. 8, whose Steps are referred to in the following discussion unless the Steps of another Figure are specifically indicated.

Steps 1–7 of FIG. 8 operate in the same manner as Steps 1–7 for a simple expect.

Steps 10–11 of FIG. 8 operate in the same manner as Steps 9–10 for a simple expect.

Steps 8 and 9 of the restricted expect, however, are different from Step 8 of the simple expect. While Step 8 of the FIG. 6 merely tests whether signal1 matches the expected value, Step 8 of FIG. 8 asks whether the value of signal1 has changed in value. If not, then the restricted expect proceeds to Step 10 since there may still be remaining window time during which signal1 may change. Step 9 of FIG. 8 is executed if and when signal1 does change in value. Also unlike Step 8 of FIG. 6, Step 9 of FIG. 8 will immediately generate a simulation error if the value of signal1 does not match the expected value upon the first occurrence of a change in signal1's value. Therefore, Step 9 of FIG. 8 requires that the very first change to signal1's value, since the window period began, be one that leads to a satisfaction of expectations. If those expectations are satisfied, the processing of this restricted expect is completed successfully and the flow of control proceeds to the next Vera language statement.

For each of the varieties of expects described above, the checking that is done during a time window, if such a window is specified, is called a "floating expect." The three varieties of checking done during a time window are therefore called simple floating expect, full floating expect and restricted floating expect.

While the above description of simple, full and restricted expects are in terms of checking a single value of a signal in fact the expect_list for each of these expects can test for the values of multiple signals. The syntax for specifying a signal or signals, and the value each is expected to be, is illustrated in FIGS. 3A, 3B and 4.

The expect_list of a particular expect consists of one or more "expressions" which are all connected as shown in FIG. 3A or 3B. Each "expression" of FIG. 3 or 3B is organized as shown in FIG. 4. Each "expression" comprises a signal_name whose value must bear the relation of "operator" to a value_expression in order for the value of the "expression" to evaluate to TRUE (also known as being satisfied). FIG. 3A is an AND connection of "expressions" in which expression1 to expressionN must all evaluate to TRUE in order for the entire expect_list to be TRUE (also known as being satisfied). FIG. 3B is an OR connection of "expressions" in which any one of expression1 to expressionN evaluating to TRUE results in the entire expect_list being TRUE (also known as being satisfied).

The permissible "operators" for an "expression" are "==" (equal) or "!=" (not equal).

The permissible value expression is a number expressed in the NUMBER format as described in Section 3.1.6, Microfiche Appendix. The basic format for the NUMBER format is shown in FIG. 5. <size>, which is optional, specifies the total number of bits to be used for storing the value represented by value_expression. '<base> specifies the base in which to express the <number>. It is often desirable to use a <base> of hex ('h), octal ('o) or binary ('b), since these permit easy testing of individual bits. The value "X" can be included in <number> to express "don't care" bit positions.

The "delay" and "window" specifications must always be an integer >=0. A "window" is specified by the syntax ", n."

The general rule for determining the delay/window clock is as follows. Each signal_name specified as part of the expect_list has a particular relation to a particular Verilog clock, and an edge of that Verilog clock, by virtue of its inclusion in a Vera interface statement. The delay/window clock utilized for measuring the "delay" and "window" length is, by convention, the clock and the particular edge of that clock associated with the leftmost signal name in the expect_list.

When the expect_list comprises >1 signal_names, the flowcharts of FIGS. 6A, 6B, 7A, 7B and 8 change as follows. For each Step where a test is made as to whether signal1 matches an expected value, the test is satisfied if the appropriate AND or OR, of multiple signal_name comparisons, is satisfied.

Typically, upon the occurrence of a simulation error, Vera does the following: i) prints a detailed diagnostic message and ii) halts the simulation. The user can choose other modes of simulation error response, such as continuing the simulation or entering a debugger. These other modes are covered in Section 18.5, Microfiche Appendix. Other tasks and functions related to simulation errors are covered in Section 7.3, Microfiche Appendix.

3. Restricted Expect Implementation

In terms of the Verilog/Vera interfacing and synchronization, described above in Section 1 of this patent, the restricted expect operates as follows.

When the context in which the restricted expect is located, call it context(X), reaches the restricted expect statement while be processed by vera_main on the run queue, the following happens.

The operation of the restricted expect should be understood in conjunction with the flowchart of FIG. 9 whose Steps are referred to in the following discussion.

The first action of context(X) is to check (Step 1) whether the "delay" specified next to the expect_operator "@@@" is >0. If the delay is >0, then a special counter is set (Step 2). This special counter was not discussed in the Overview re Verilog and Vera of Section 1 above. This special counter is accessible by vera_main when it is deciding whether to transfer a context from the wait queue to the run queue. The special counter is set with the number of cycles of the delay/window clock which must occur before the expect_list should be considered.

Next, context(X) is moved to the wait queue where it waits for the next cycle of the delay/window clock (Steps 3 and 4).

Context(X) stays on the wait queue until a cycle of the delay/window clock occurs. This waiting on the wait queue corresponds, in the flowchart of FIG. 9, to the flow of control stopping at Step 4 until the next delay/window clock occurs.

When the next delay/window clock occurs, vera_main does the following with context(X). Without taking context (X) off the wait queue, vera_main is able to decrement the special counter (Step 5) and then test whether the special counter is zero (Step 6).

If the special counter is zero, then the delay period has passed and execution of the restricted expect should continue at Step 7 of FIG. 9. If the special counter is not zero, then context(X) is put back on the wait queue (Step 3) and it once again waits for the next delay/window clock (Step 4).

Processing of the restricted expect continues at Step 7 by vera_main taking context(X) off the wait queue and putting it on the run queue.

Once it's back on the run queue, the first action of context(X) is to set (Step 8) delay/window clock as a potential trigger for causing vera_main to transfer context (X) from the wait queue to the run queue. Note that if a zero delay is detected in Step 1 above, then Step 8 is jumped to directly.

Step 9 then puts context(X) back on the wait queue.

Step 10 represents the waiting of context(X) on the wait queue by having the flow of control wait at Step 10 until a transition occurs for delay/window clock.

Once a transition of the delay/window clock occurs, Step 11 moves context(X) from the wait queue back to the run queue.

The first action that context(X) takes, once it's back on the run queue, is to check (Step 12) whether the current values of the nodes of the Verilog model, specified by the signal_names of the expect_list, satisfy the condition being tested for by the expect_list. Context(X) is able to check the nodes of the Verilog model through the PLI calls, discussed above, which allow Vera to sample the value of Verilog nodes. If the expect_list is satisfied, then the processing of the restricted expect statement is finished and the flow of control must "fall through" immediately to the next Vera language statement. If the expect_list is not satisfied, then processing continues (Step 13) to determine whether a window period has been specified.

If a "window" >0 has been specified, then processing continues (Step 14). Otherwise, a simulation error is generated since the expect_list was not satisfied immediately upon elapse of the delay period and no window period is specified.

If a window period is specified, then a window counter, maintained as part of context(X), is created. This window counter is initialized with the number of cycles of the delay/window clock which constitute the window period. In addition to setting up context(X) with a window counter, context(X) is also set to have the delay/window clock become a potential trigger for causing vera_main to transfer context(X) from the wait queue to the run queue.

Context(X) is then put on the wait queue (Step 15).

The waiting of context(X) on the wait queue, for the next transition of the delay/window clock, is indicated in the flowchart of FIG. 9 by the flow of control waiting at Step 16.

When the next delay/window clock occurs, the flowchart continues to Step 17.

Step 17 moves context(X) back to the run queue.

Once being run again, the first thing context(X) does is to check (Step 18) whether any of the current values of the Verilog model, specified by the signal_names of the expect_list, have changed (also known as transitioned) since the last occurrence of the delay/window clock. If a transition has occurred, then Step 19 is executed. If no transition has occurred, then processing continues with Step 20 since there may still be more window period remaining during which such a transition, of one of the signal_name nodes specified by the expect_list, can occur.

Step 19 checks whether the current values of the Verilog nodes specified by the expect_list satisfy the expected values of the expect_list. If the expect_list is satisfied, then the processing of the restricted expect statement is finished and the flow of control must fall through immediately to the next Vera language statement. If the expect_list is not satisfied, a simulation error is generated since the very first transition of the expect_list, since monitoring began for the window period, has not resulted in the expect_list being satisfied.

Step 20 decrements the window counter of context(X). If the window counter is zero (as determined by Step 21), then a simulation error is generated since the end of the window period has been reached without any transition of the expect_list. If the window counter is still greater than zero, then context(X) is put back on the wait queue (Step 15) where it then waits (Step 16) for the next clock to occur of the delay/window clock.

4. Additional Expect Functionality

As discussed in Section 4.4.4.4 of the Microfiche Appendix, an expect may be made "soft" by suffixing the expect_list with the keyword "soft." Rather than generating a simulation error, a soft expect sets an error flag and the simulation continues. The value of the error flag can be checked with a "flag()" function as discussed in Section 7.3.1, Microfiche Appendix.

To provide greater control over the selection of the delay/window clock, as discussed in Section 4.4.4.5 of the Microfiche Appendix, the signal_name of an expect_list "expression" can be compared for equality with the special value_expression "void." The result of comparing signal_name with "void" is always TRUE when the comparison is part of an ANDing of "expressions" (as shown in FIG. 3A). The result of comparing signal_name with "void" is always FALSE when the comparison is part of an ORing of "expressions" (as shown in FIG. 3B). This comparison with "void" is simply made the leftmost "expression" of the expect_list. The clock for the signal being compared with "void" then becomes the delay/window clock for the expect statement, without the value of the signal itself necessarily influencing whether the expect_list is satisfied. Of course, the value of the signal being compared to "void" can be made to also influence whether the expect_list is satisfied by being included in another "expression" of the expect_list which compares it to a non-void value.

As discussed in Section 4.5 of the Microfiche Appendix, an expect may be made asynchronous by suffixing the expect_list with the keyword "async." "async" causes the "delay" and "window" specifications to be ignored and an immediate determination is made of whether the expect_list is satisfied. The "async" check is made even more immediately than if a "delay" is specified as zero for one of the non-asynchronous expects described above. This is because there is no waiting for the occurrence of a clock edge of the delay/window clock before examining whether the Verilog nodes satisfy the expect_list. Rather, the asynchronous expect has a very simplified flowchart, compared with FIG. 9, which just consists of a Step like Step 12 as its first and only Step. If the current values of the nodes of the Verilog model do satisfy the expect_list, then the action of this one Step is to have processing fall through immediately to the next Vera language statement after the expect. If the current values of the nodes of the Verilog model do not satisfy the expect_list, then the action of this one Step differs from Step 12 of FIG. 9 in its immediate generation of a simulation error. "async" would typically be used in conjunction with the "delay" function, also discussed in Section 4.5 of the Microfiche Appendix, which allows the programmer to block the flow of control of a Vera language program by a certain amount of time with respect to the Verilog side of the simulation. This combination of "async" and the delay function is to permit expects to be performed at any precise moment of time in the Verilog simulation.

5. Hardware Environment

Typically, the expect monitoring of the present invention is executed within the computing environment (or data processing system) such as that of FIG. 10. FIG. 10 depicts a workstation computer 1000 comprising a Central Processing Unit (CPU) 1001 (or other appropriate processor or processors) and a memory 1002. Memory 1002 has a portion of its memory in which is stored the software tools and data of the present invention. While memory 1003 is depicted as a single region, those of ordinary skill in the art will appreciate that, in fact, such software may be distributed over several memory regions or several computers. Furthermore, depending upon the computer's memory organization (such as virtual memory), memory 1002 may comprise several types of memory (including cache, random access memory, hard disk and networked file server). Computer 1000 is typically equipped with a display monitor 1005, a mouse pointing device 1004 and a keyboard 1006 to provide interactivity between the software of the present invention and the chip designer. Computer 1000 also includes a way of reading computer readable instructions from a computer readable medium 1007, via a medium reader 1008, into the memory 1002. Computer 1000 also includes a way of reading computer readable instructions via the Internet (or other network) through network interface 1009.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims and equivalents.

What is claimed is:

1. A method for monitoring a device under test, comprising the steps performed by a data processing system of:

applying a stimulus to a first input of the device under test;

monitoring a first output of the device under test for a first window period, wherein the monitoring begins with the first output not being a first output value; and concluding the monitoring before the first window period ends if, upon a first occurrence of a transition of the first output since monitoring the first output, the first output value is not output by the device under test.

2. The method of claim 1, further comprising:

delaying a first delay period before monitoring the device under test.

3. The method of claim 1, wherein concluding the monitoring includes indicating a second condition.

4. The method of claim 3, wherein the second condition indicates a simulation error.

5. The method of claim 1, further comprising:

indicating a third condition if the first window period ends without a first occurrence of a transition of the first output.

6. The method of claim 5, wherein the third condition indicates a simulation error.

7. The method of claim 1, further comprising:

interpreting a first model of an environment for the device under test, described in a verification language, prior to applying the stimulus to the first input.

8. The method of claim 1, further comprising:

compiling a first model of an environment for the device under test, described in a verification language, prior to applying the stimulus to the first input.

9. The method of claim 1, further comprising:

applying a second stimulus to the device under test, if upon the first occurrence of the transition of the first output, the first output value is output by the device under test.

10. The method of claim 1, further comprising:

applying a second stimulus to the device under test, after an end of the monitoring of the first output, if the first occurrence of the transition of the first output does not occur.

11. The method of claim 1, wherein the device under test is described in a hardware description language.

12. A data processing system for monitoring a device under test, comprising:

a circuit configured to apply a stimulus to a first input of the device under test;

a circuit configured to monitor a first output of the device under test for a first window period, wherein the monitoring begins with the first output not being a first output value; and a circuit configured to conclude the monitoring before the first window period ends if, upon a first occurrence of a transition of the first output since monitoring the first output, the first output value is not output by the device under test.

13. The system of claim 12, wherein the device under test is described in a hardware description language.

14. A computer program product comprising:

a computer usable medium having computer readable code embodied therein for causing circuit monitoring of a device under test, the computer program product including:

computer readable program code devices configured to cause a computer to effect applying a stimulus to a first input of the device under test;

computer readable program code devices configured to cause a computer to effect monitoring a first output of the device under test for a first window period, wherein the monitoring begins with the first output not being a first output value; and computer readable program code devices configured to cause a computer to effect concluding the monitoring before the first window period ends if, upon a first occurrence of a transition of the first output since monitoring the first output, the first output value is not output by the device under test.

15. The computer program product of claim 14, wherein the device under test is described in a hardware description language.

* * * * *